(12) United States Patent
Chen et al.

(10) Patent No.: US 7,087,991 B2
(45) Date of Patent: Aug. 8, 2006

(54) INTEGRATED CIRCUIT PACKAGE AND METHOD OF MANUFACTURE

(75) Inventors: Kuo-Tso Chen, Hsinchu (TW); Chen-Yueh Kung, Taoyuan Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 447 days.

(21) Appl. No.: 10/063,793

(22) Filed: May 14, 2002

(65) Prior Publication Data
US 2003/0133274 A1    Jul. 17, 2003

(30) Foreign Application Priority Data
Jan. 16, 2002    (TW)    ................. 91100554 A

(51) Int. Cl.
*H01L 23/522*    (2006.01)
(52) U.S. Cl. ............... 257/700; 257/698; 438/125; 29/832; 29/852; 361/793
(58) Field of Classification Search ............... 257/698, 257/700; 438/125; 29/832, 852; 361/792–795
See application file for complete search history.

(56) References Cited

U.S. PATENT DOCUMENTS

| | | | | |
|---|---|---|---|---|
| 5,111,278 A | * | 5/1992 | Eichelberger | ............... 257/698 |
| 5,157,589 A | * | 10/1992 | Cole et al. | ................. 361/795 |
| 5,315,486 A | * | 5/1994 | Fillion et al. | ............... 361/795 |
| 6,274,391 B1 | * | 8/2001 | Wachtler et al. | ............... 438/6 |
| 6,400,573 B1 | * | 6/2002 | Mowatt et al. | ............. 361/719 |
| 6,724,079 B1 | * | 4/2004 | Viswanathan et al. | ...... 257/704 |
| 2003/0134455 A1 | * | 7/2003 | Cheng et al. | ............... 438/125 |
| 2004/0014317 A1 | * | 1/2004 | Sakamoto et al. | .......... 438/689 |

FOREIGN PATENT DOCUMENTS

| | | | |
|---|---|---|---|
| JP | 10284632 A | * | 10/1998 |
| JP | 2000260902 A | * | 9/2000 |

OTHER PUBLICATIONS

ACCURATUS data sheet for Aluminum Oxide (Alumina), publ. 2002, four sheets (Obtained on the Internet).*
ACCURATUS data sheet for Aluminum Nitride, publ. 2002, two sheets (Obtained on the Internet).*

(Continued)

*Primary Examiner*—John B. Vigushin
(74) *Attorney, Agent, or Firm*—Jiang Chyun IP Office

(57) ABSTRACT

An integrated circuit package and a method of manufacturing the package. A silicon chip is attached to the surface of a substrate or attached to the bottom surface of a cavity in the substrate so that the active surface of the chip is exposed. One or more build-up circuit structures are formed over the substrate. Each build-up circuit structure has at least one insulation layer, at least one patterned circuit layer and a plurality of via openings with conductive material therein so that bonding pads on the active surface of the chip connect electrically with the patterned circuit layer through the vias. To form a ball grid array package, solder balls may also be attached to the solder ball pads on the patterned circuit layer so that the bonding pads on the chip are electrically connected to an external circuit through the build-up circuit structure and the solder balls.

26 Claims, 7 Drawing Sheets

OTHER PUBLICATIONS

Definition of "circuit" from Newnes Dictionary of Electronics, Newnes 1999 (one sheet).*

Definition of "circuit" from Hargrave's Communications Dictionary, Wiley 2001 (one sheet).*

* cited by examiner

INTEGRATED CIRCUIT PACKAGE AND METHOD OF MANUFACTURE

CROSS REFERENCE TO RELATED APPLICATIONS

This application claims the priority benefit of Taiwan application Serial no. 91100554, filed Jan. 16, 2002.

BACKGROUND OF INVENTION

1. Field of Invention

The present invention relates to an integrated circuit package and method of manufacture. More particularly, the present invention relates to an integrated circuit package having a built-up circuit instead of a conventional substrate and a method of manufacturing the integrated circuit package.

2. Description of Related Art

In step with the rapid progress in electronic technologies, high-tech electronic products having more powerful and personalized functions continue to appear in the market. In general, electronic products are designed towards having a lower dead weight, a smaller and slimmer outline, and being easier to carry. The manufacturing of integrated circuits (IC) is a major stage in fabricating most electronic products. ICs may be packaged into a variety of forms including dual-in-line (DIP) package, ball grid array (BGA) package, and tape automatic bonding (TAB), with each having a particular usage.

In a ball grid array (BGA) package, solder balls are attached to the lower surface of a substrate instead of having a conventional lead frame with leads. Bonding pads on a silicon chip are connected to respective contact points on the substrate of a BGA package either through wire bonding or a flip chip connection. Through trace lines inside the substrate, the contact points on the substrate are re-wired to other contact points on the surface of the substrate. The contact points on side of the substrate are electrically connected to contact points on the other side or the lower surface of the substrate through vias. Finally, solder balls are planted onto the contact points on the lower surface. Because the entire lower surface may be used to distribute contact points in a ball grid array package, a high pin count package is produced. Since surface tension produced by solder balls during a reflow operation has an auto-alignment effect, greater misalignment can be tolerated. In addition, good electrical connection between the solder balls and bonding pads on the chip is one of the reasons for the popularity of BGA packages in IC fabrication.

FIG. 1 is a schematic cross-sectional view of a conventional ball grid array package. A ball grid array package 100 having a chip 200 attached to the backside of a substrate 110 is provided. Bonding pads 202 on the chip 200 connect electrically with corresponding contact points on the substrate 110 by conductive wires 120. The conductive wires 120 are formed in a wire bonding operation. Packaging material 130 encloses the chip 200, the conductive wires 120 and the contact points 112. Solder balls 140 are implanted onto the bonding pads 114 on the substrate 110 so that the chip 200 is electrically connected to an external circuit through the conductive wires 120, trace lines 116 within the substrate 110, and the solder balls 140.

FIG. 2 is a schematic cross-sectional view of an alternative conventional ball grid array package. One major aspect is that a flip-chip connection method instead of a wire bonding method is used inside the ball grid array package 101. Bumps 204 are formed on the bonding pads 202 of a chip 200. The chip is flipped over so that the bumps 204 directly contact the contact points 112 on a substrate 110. The chip 200 connects electrically with an external circuit through the bumps 204, trace lines 116 within the substrate 110, and the solder balls 140.

In general, a ball grid array package that uses conductive wires to connect with the chip has bigger signaling time delay due to higher electrical impedance of conductive wires. Hence, performance of the chip may be affected. On the other hand, a ball grid array package that uses a flip-chip structure must provide extra bumps on the bonding pads of the chip and align the bumps precisely over corresponding contact points on a substrate. Therefore, the number of manufacturing steps is increased and production cost is ultimately raised.

Furthermore, a high pin count chip is typically enclosed inside a ball grid array package. Hence, a substrate having fine pitch contact points must be used to connect the bonding pads on the chip with the contact points on the substrate no matter whether the connection is achieved through conductive wires or flip-chip. The trace width of a conventional printed circuit board (PCB) is about 100 μm while the pitch between contact points is roughly between 800~1200 μm. Yet, the fine pitch contacts in the substrate of a ball grid array package has a trace width of about 30 μm while the pitch between bonding pads is about 150 μm. Therefore, compared with a conventional printed circuit board, cost of producing the substrate with fine pitch contacts is considerably higher. The fabrication cost is estimated to be about 20% of the cost of forming the entire ball grid array package. The cost of fabricating a substrate suitable for forming a flip-chip package is even higher.

SUMMARY OF INVENTION

Accordingly, one object of the present invention is to provide an integrated circuit package and its method of manufacture. The package eliminates the connective requirements between a substrate and a silicon chip such as wire bonding or flip-chip bonding but still manages to tolerate the contact point pitch originally used by the substrate. Hence, production cost of the integrated circuit package is reduced and performance of the package is increased. Furthermore, the IC package has a higher heat dissipation rate and engenders less limitation due to flip-chip bumps.

To achieve these and other advantages and in accordance with the purpose of the invention, as embodied and broadly described herein, the invention provides an integrated circuit package. The integrated circuit package has a substrate and at least one silicon chip. The chip has a backside surface and an active surface. The backside of the chip is attached to the substrate. The active surface has a plurality of bonding pads. In addition, the package further includes a build-up circuit structure over the substrate. The built-up circuit structure further includes at least one insulation layer, at least one patterned circuit layer and a plurality of via openings. The insulation layer is located between the active surface and the patterned circuit layer. The via openings correspond to the bonding pads and pass through the insulation layer. The via openings are deposited with a conductive material so that the patterned circuit layer and the bonding pads on the chip are electrically connected through the conductive material inside the via openings. To form a ball grid array package, the patterned circuit layer further includes a plurality of solder ball pads. In addition, a passivation layer is formed over the patterned circuit layer. The passivation layer has a plurality of openings that expose the solder ball pads on the patterned circuit layer. Lastly, solder balls are attached to the solder ball pads of the package.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
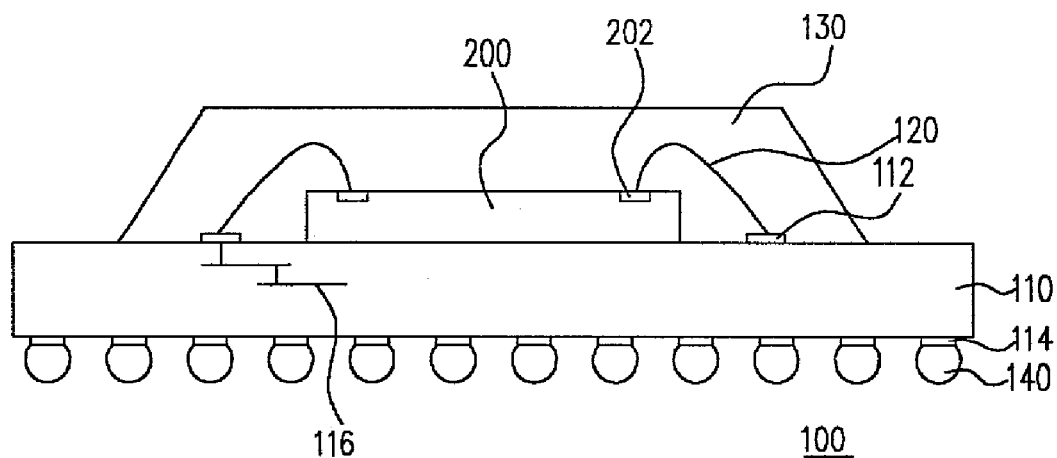
FIG. 1 is a schematic cross-sectional view of a conventional ball grid array package.
Figure 2:
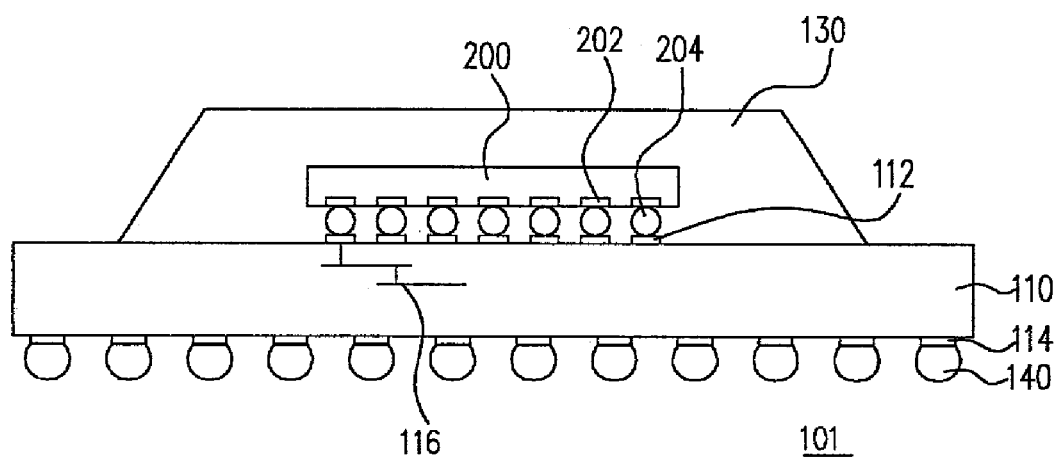
FIG. 2 is a schematic cross-sectional view of an alternative conventional ball grid array package.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
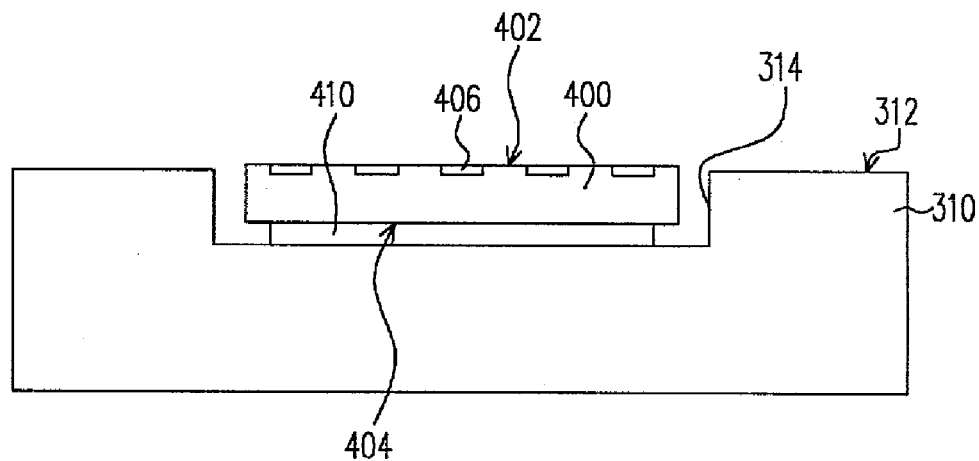
FIGS. 3A to 3I are schematic cross-sectional views showing the progression of steps for producing an integrated circuit package according to one preferred embodiment of this invention.

FIGS. 3A to 3I are schematic cross-sectional views showing the progression of steps for producing an integrated circuit package according to one preferred embodiment of this invention. As shown in FIG. 3A, a substrate 310 having a cavity 314 thereon is selectively provided. The cavity 314 is on the upper surface 312 of the substrate 310 but does not have to be located right in the middle of the substrate 310 as shown in FIG. 3A. In addition, a chip 400 having an active surface 402 and a backside surface 404 is also provided. The backside 404 of the chip 400 is attached to the bottom surface of the cavity 314. However, the chip may also be attached to the upper surface 312 of the substrate 310 so that the active surface 402 of the chip 400 is exposed. The active surface 402 of the chip 400 further includes a plurality of bonding pads 406 that serve as output contact points. In general, the active surface 402 of the chip 400 refers the side of a chip having useful devices. A paste 410 is often used to bond the chip 400 onto the bottom surface of the cavity 314. The paste 410 can be a conductive bonding material such as silver paste and conductive glue or a non-conducting bonding material such as adhesive tape.

Figure 3B:
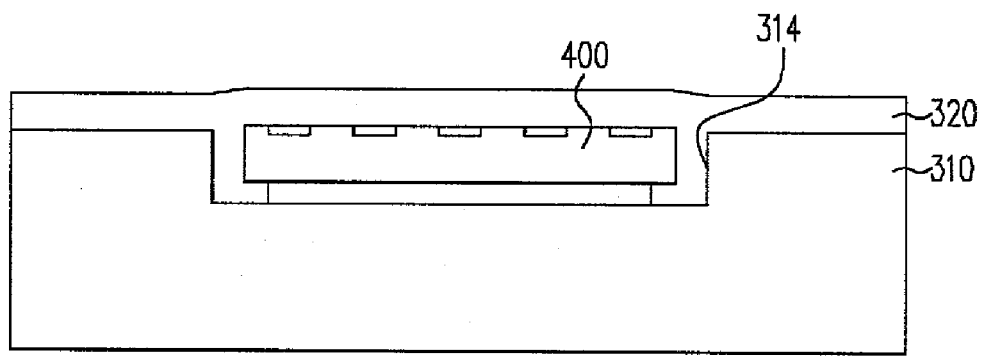

As shown in FIG. 3B, an insulation layer 320 is formed over the substrate 310 and the chip 400 so that the space between the cavity 314 and the chip 400 is also filled. The insulation layer 320 is formed, for example, by spin coating, screen printing or roller coating. The insulating material forming the insulation layer 320 includes photo-imageable dielectric (PID), glass, resin or other curable material.

Figure 3C:
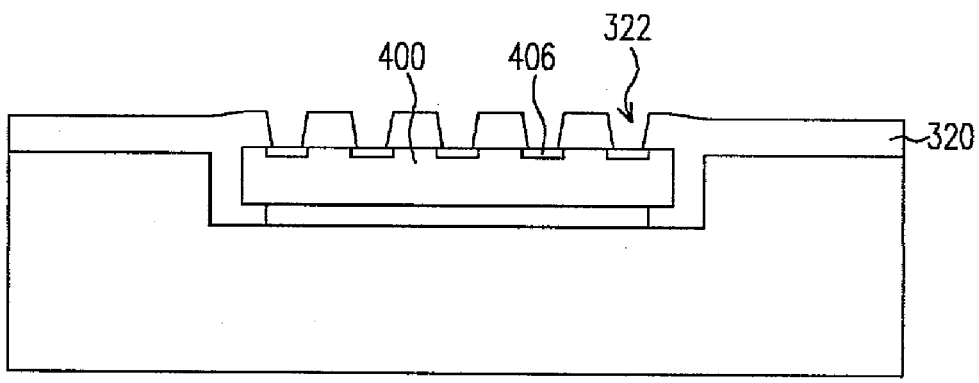

As shown in FIG. 3C, a plurality of via openings 322 is formed in the insulation layer 320. The via openings 322 expose the bonding pads 406 on the chip 400. The via opening 322 is formed, for example, by performing a photo-via operation, conducting a laser ablation or carrying out a plasma etching operation.

Figure 3D:
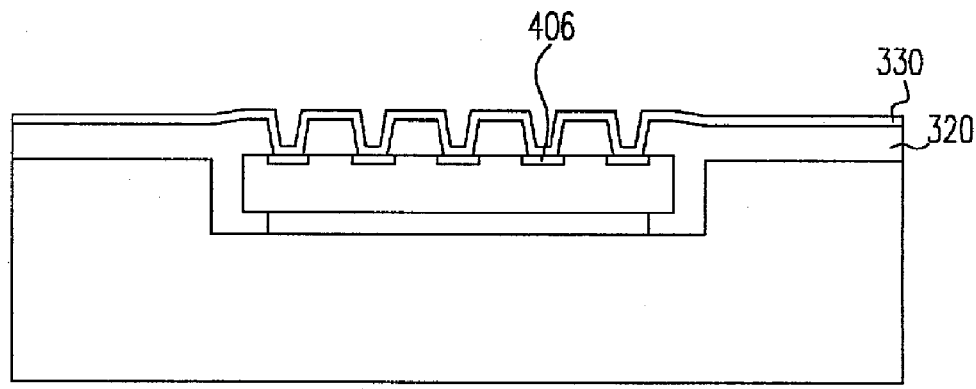

As shown in FIG. 3D, a thin metallic layer 330 is formed over the insulation layer 320 and the bonding pads 406. The thin metallic layer 330 serves as a seed layer for a subsequent electroplating operation. For example, a copper film is formed over the insulation layer 320 and the bonding pads 406 chemically to serve as a seed layer.

Figure 3E:
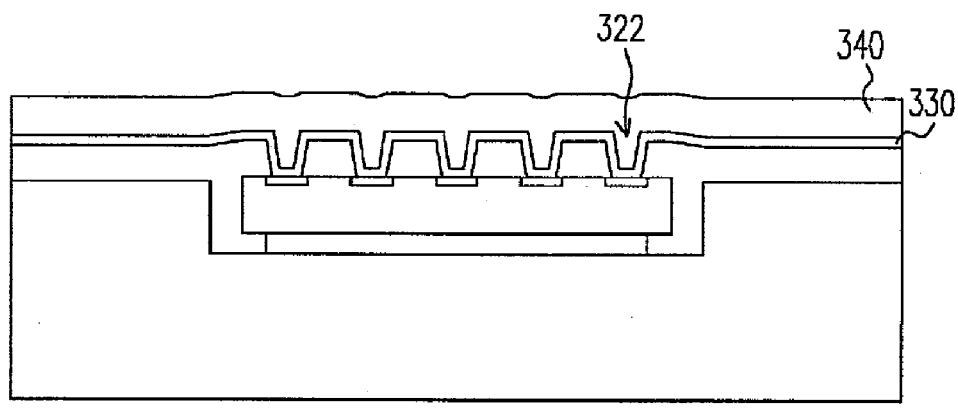

As shown in FIG. 3E, a metallic layer 340 is formed over the thin metallic layer 330 by conducting an electroplating operation. The metallic layer completely fills the via openings 322.

Figure 3F:
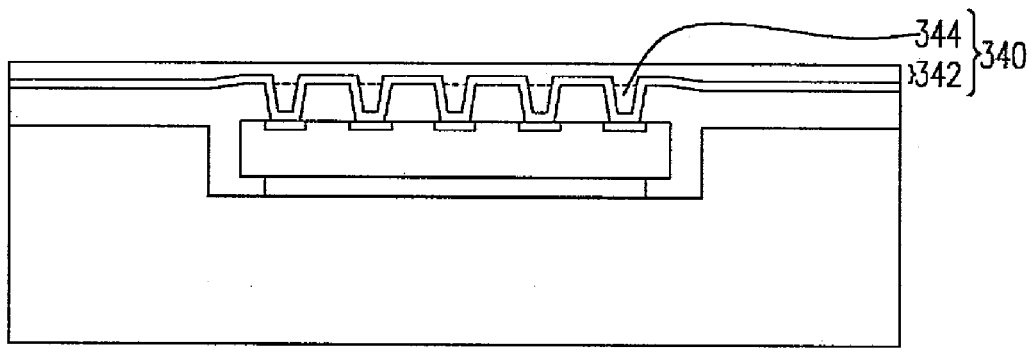

As shown in FIG. 3F, the metallic layer 340 is planarized. At this stage, the metallic layer 340 can be roughly divided into circuit layer 342 and filler sections 344. The filler sections 344 completely fills up the via openings 322. The metallic layer 340 is planarized through chemical-mechanical polishing (CMP). However, the planarization step may be skipped if high surface planarity is not required.

Figure 3G:
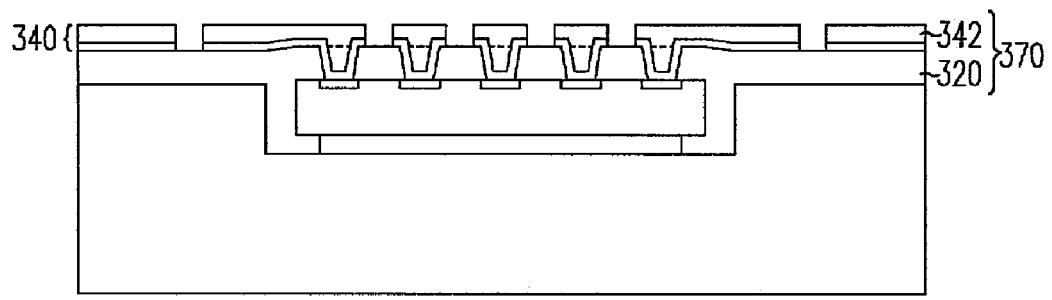

As shown in FIG. 3G, photolithographic and etching processes are conducted to remove a portion of the circuit layer 342 so that the circuit layer 342 is patterned. The patterned circuit layer 342 and the insulation layer 320 together form a build-up circuit structure 370. The aforementioned steps may be repeated several times to form several build-up circuit structures 370 one on top of each other so as to produce the desired trace line layout. In fabricating a non-ball-grid-array package (for example, if a lead pin directly contacts a tape line through conductive paste), the steps of forming a passivation layer and solder ball pads over the chip 400 and the substrate 310 and attaching solder balls to the solder ball pads are skipped. However, to fabricate a ball grid array package, the following steps are required.

Figure 3H:
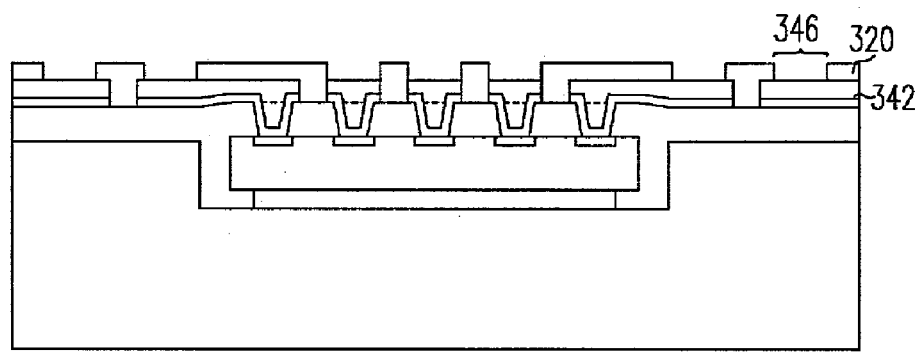

As shown in FIG. 3H, a patterned passivation layer such as a solder mask is formed over the patterned circuit layer 342 by conducting a screen printing process, a coating and photolithographic process or some other methods. The passivation layer exposes a portion of the circuit layer 342 and produces solder ball pads 346.

Figure 3I:
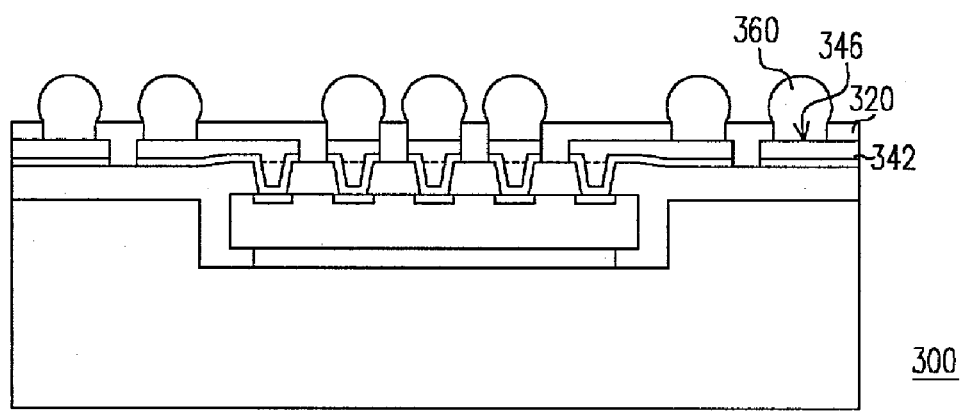

As shown in FIG. 3I, solder balls 360 are planted onto various solder ball pads 346 to form a complete ball grid array package 300.

Although having the backside 404 of the chip 400 align with the substrate 310 via the adhesive paste 410 is preferred as shown in FIG. 3G, absolute alignment is unnecessary. Furthermore, although that portion of the insulation layer 320 outside the via opening regions and on the surface of the metallic layer 340 having a relatively planar surface is essential to subsequent manufacturing steps, planarity is by no means an absolute requirement. Rather than having a fixed pitch between neighboring solder balls 360 as shown in FIG. 3I, the pitch may be adjusted according to actual requirements. In addition, the circuit layer 342 is free to expand or contract between the active surface 402 of the chip 400 and the surface 312 of the substrate 310.

Figure 4A:
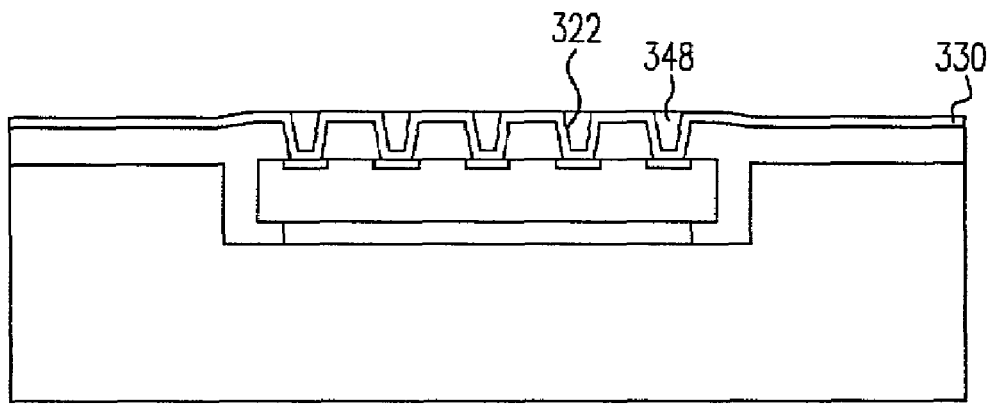
FIGS. 4A and 4B are schematic cross-sectional views showing the steps for forming the conductive material layer and the circuit layer according to this invention.
Figure 4B:
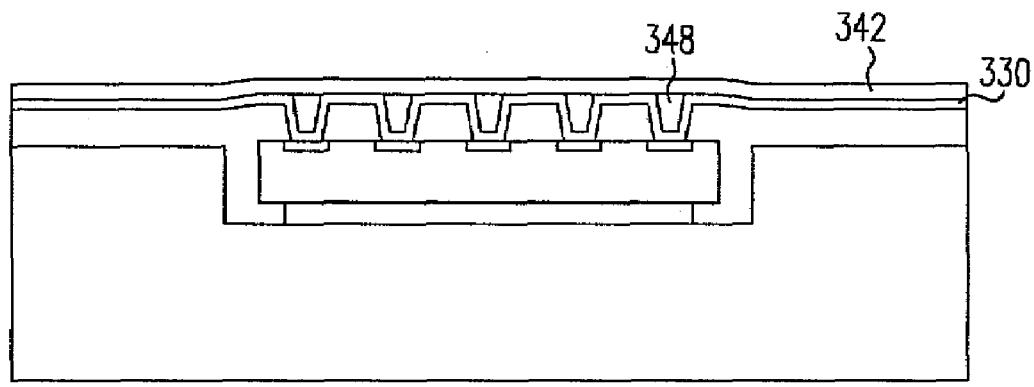

Aside from using the metallic layer 340 to serve as the circuit layer 342 and substance constituting the filler sections 344 as shown in FIG. 3F, the circuit layer 342 and the filler sections 344 may also be produced in two separate manufacturing steps. Hence, after forming the thin metallic layer 330 over the insulation layer 320 and the bonding pads 406 as shown in FIG. 3D, the manufacturing step may branch off to the one in FIG. 4A. FIGS. 4A and 4B are schematic cross-sectional views showing the steps for forming the conductive material layer and the circuit layer according to this invention. As shown in FIG. 4A, a conductive material 348 is deposited into the via openings 322 similar to depositing metallic material to form the filler section 344 in FIG. 3F. The conductive material 348 is deposited by screen printing. The conductive material may be conductive glue such as silver paste or copper paste. As shown in FIG. 4B, a circuit layer 342 is formed over the thin metallic layer 330 and the conductive material layer 348, for example, by conducting an electroplating operation. Thereafter, the manufacturing steps from FIGS. 3G to 3I are carried out. Since these steps have already been described before, detailed description is omitted here.

Figure 5A:
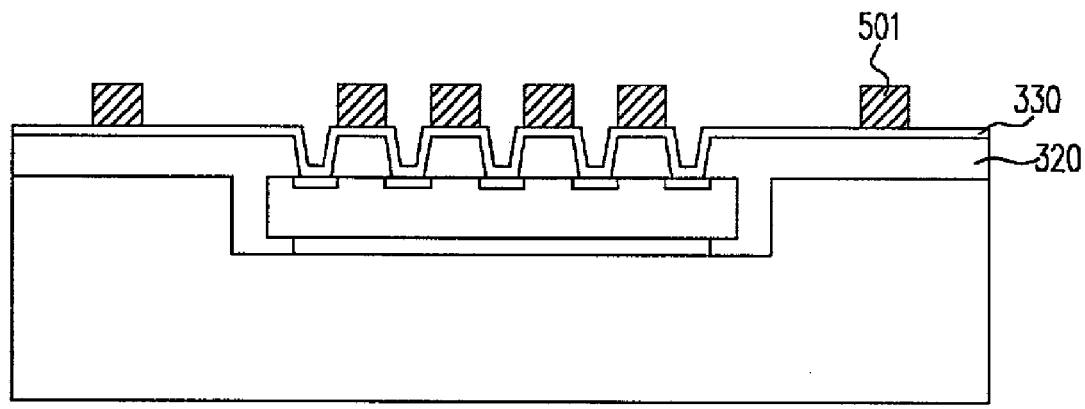
FIGS. 5A and 5B are schematic cross-sectional views showing the steps for forming the circuit layer according to this invention.
Figure 5B:
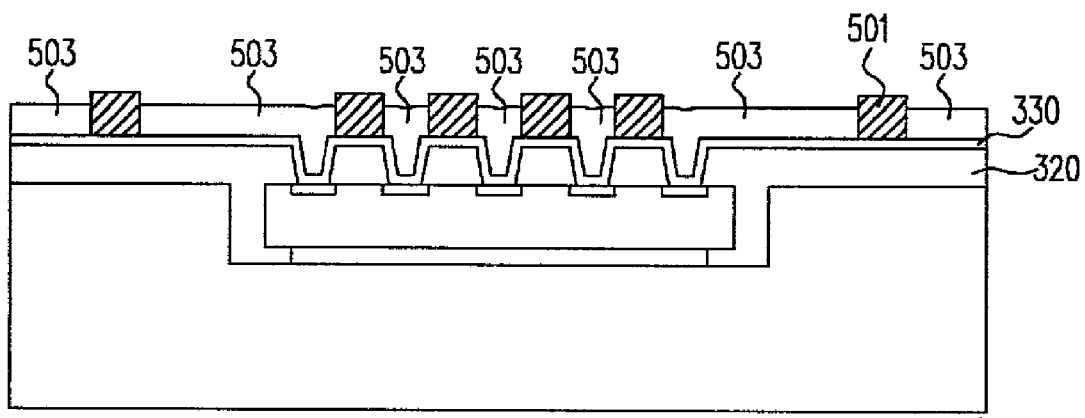

FIGS. 5A and 5B are schematic cross-sectional views showing the steps for forming the circuit layer according to this invention. As shown in FIG. 5A, the circuit layer 342 as shown in FIG. 3G may be formed by coating a photoresist layer 501 over the thin metallic layer 330 (as shown in FIG. 3D), conducting a photo-exposure and developing the photoresist layer 501. Next, as shown in FIG. 5B, an electroplating operation is conducted to form a circuit layer 503 in the areas not covered by any photoresist material. Thereafter, the photoresist layer 501 is removed and a short etching operation is carried out to remove the thin conductive layer 330 underneath the former photoresist layer 501. Henceforth, the steps shown in FIGS. 3H to 3I are carried out. Since these steps have already been described before, detailed description is omitted here.

The substrate 310 as shown in FIG. 3I can be a metallic layer, a glass layer, a polymer material layer or some other material. Because the chip 400 will produce considerable heat while in operation, a metallic substrate or a thermal conductive substrate may increase the heat-dissipating rate of the chip 400 and improve performance.

Figure 6:
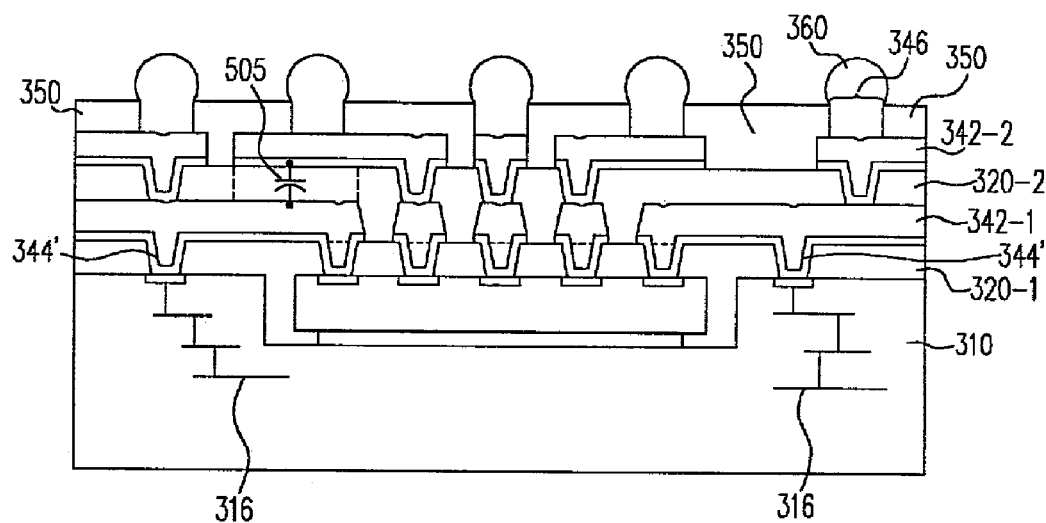
FIG. 6 is a schematic cross-sectional view showing the internal circuit and substrate inside an integrated circuit package fabricated according to this invention.

FIG. 6 is a schematic cross-sectional view showing the internal circuit and substrate inside an integrated circuit package fabricated according to this invention. As shown in FIG. 6, the substrate 310 may further include an internal circuit 316. The internal circuit 316 includes, for example, a capacitor, an inductor, or both. By incorporating a design in the filler section 344, the circuit 316 inside the substrate 310 is electrically connected to the bonding pads 406 of the chip 400 or the patterned circuit layer 342 through the filler sections 344". Ultimately, the integrated circuit inside the ball grid array package 301 can have greater circuit layout flexibility.

Furthermore, after conducting the step depicted in FIG. 3H, the steps from 3C to 3H may be repeated to produce a multiple of circuit layers such as 342-1 and 342-2. Aside from providing a greater flexibility in circuit design of the package, the additional circuit layer 342-2 may also serve as an earth grounding plane or a power supply plane, or alternatively, produce some capacitance in a capacitor 505 between the plane for adjusting intrinsic electrical properties of the product.

Figure 7:
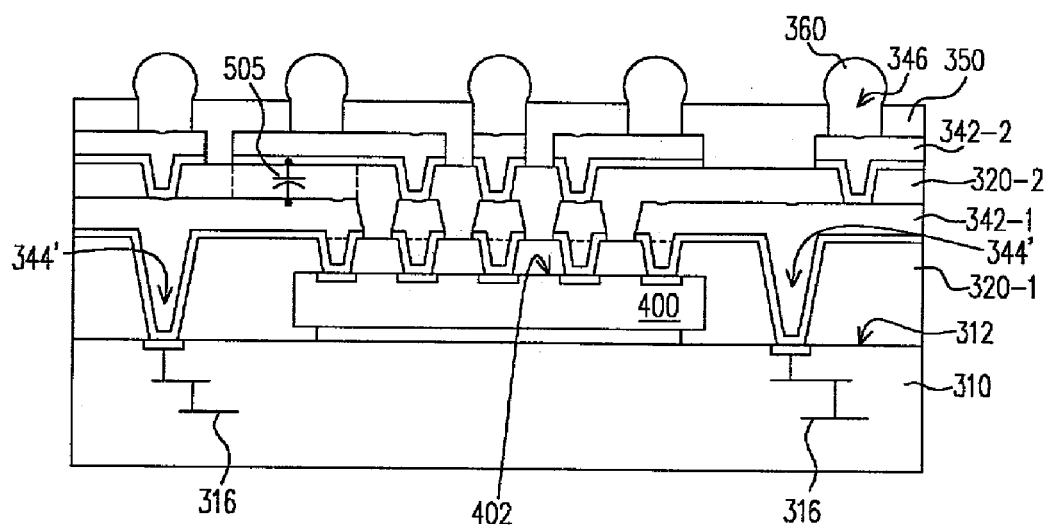
FIG. 7 is a schematic cross-sectional view showing the internal circuit and flat substrate structure inside an alternative integrated circuit package fabricated according to this invention.

FIG. 7 is a schematic cross-sectional view showing the internal circuit and flat substrate structure inside an alternative integrated circuit package fabricated according to this invention. One major aspect of the integrated circuit in FIG. 7 compared with the one in FIG. 6 is that the insulation layer 320-1 on the surface 402 of the chip 400 and the surface 312 of the substrate 310 have different thickness. Since all other aspects between the two are identical, detailed description is omitted. In addition, if thickness of the insulation layer 320 over the surface 402 of the chip 400 and the surface 312 of the substrate 310 is chosen to be identical, thickness of the circuit layer 342-1 may be adjusted. Similarly, planarity of various layers above the insulation layer 320-1 may also be improved.

One major aspect of the integrated circuit package according to this invention is the attachment of a chip in the cavity in a substrate or on the upper surface of a substrate and directly forming a build-up circuit structure over the substrate and the chip. Thereafter, solder balls are attached to solder ball pads on the circuit layer of the build-up circuit structure so that the chip connects with an external circuit through the trace lines inside the build-up circuit structure and the solder balls.

When the integrated circuit package structure according to this invention is applied to fabricate a ball grid array package, a fine pitch substrate is no longer needed. Furthermore, all first level (level 1) electronic fabrication processes for joining the chip and the substrate such as wire-bonding or flip-chip junction can be removed because the bonding pads on the chip and the solder balls are connected through the trace lines running inside the build-up circuit structure. Since the high impedance caused by conductive wires and bumps is removed through the introduction of the build-up circuit structure, overall performance of the package is improved.

In conclusion, major advantages of the integrated circuit package according to this invention includes:

1. High-density bonding pads crowded on a chip are expanded outward to outside regions through a circuit layer so that contact points (or solder balls) may be distributed over a printed circuit board. Hence, the integrated circuit package has a lower packaging cost than conventional high pin count packages.

2. By forming at least one build-up circuit structure directly over the chip, an integrated circuit that matches the original contact point layout is fabricated without using a conventional fine pitch contact substrate.

3. Using the build-up circuit structure instead of a fine pitch contact substrate, expensive substrate and assembling processes are no longer required. Expenditure for fabricating the chip package is greatly reduced.

4. Since the bonding pad on the chip and the solder balls are electrically connected through trace lines inside the build-up circuit structure, high impedance conductive wires or bumps are no longer used. By avoiding the use of high impedance electrical elements, performance of the chip package will improve.

5. When metallic or thermally conductive material is used to form the substrate that encloses the chip, heat-dissipating rate from the chip while in operation is increased. The metallic substrate also has the advantage of shielding the chip against electro-magnetic interference (EMI) effects. The metallic substrate may also connect to earth to serve a grounding function, thereby enhancing overall integrity of the package.

6. The substrate may also contain internal circuitry that connects with the bonding pads on the chip or the circuit layer within a build-up circuit structure so that trace line design within the integrated circuit package is more flexible.

7. The integrated circuit package not only permits the fabrication of build-up circuit structures over a single chip, but also permits the fabrication of build-up circuit structures over a set of chips all attached to a large area substrate for lowering manufacturing cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. An integrated circuit package, comprising:
   a substrate having a first surface, wherein the substrate comprises an internal circuit;
   a chip having an active surface with a plurality of bonding pads thereon and a backside surface attached to the first surface of the substrate; and
   a build-up circuit structure on the substrate, the build-up circuit structure having at least one insulation layer, at least one patterned circuit layer and a plurality of via openings,
   wherein the insulation layer is located between the active surface and the patterned circuit layer, the via openings corresponding to the bonding pads pass through the insulation layer,
   wherein the via openings are deposited with a conductive material, the patterned circuit layer electrically connects with the bonding pads through the conductive material and a portion of the patterned circuit layer expands into a region outside the active surface of the chip,
   wherein the space between the chip and the substrate is filled by the material of the insulation layer.

2. The integrated circuit package of claim 1, further comprising
   a plurality of solder ball pads on the patterned circuit layer; and
   a plurality of solder balls attached to the solder ball pads respectively.

3. The integrated circuit package of claim 2, further comprising a passivation layer disposed on the patterned circuit layer, wherein the passivation layer has a plurality of openings corresponding to the solder ball pads.

4. The integrated circuit package of claim 1, wherein the substrate is selected from one of the group consisting of metal, glass and polymer.

5. The integrated circuit package of claim 1, wherein the internal circuit in the substrate comprises at least one of a capacitor and an inductor.

6. The integrated circuit package of claim 5, wherein the internal circuit and the bonding pads on the chip are electrically connected.

7. A method of forming an integrated circuit package, comprising the steps of:
   providing a substrate having a first surface, wherein the substrate comprises an internal circuit;
   providing at least one chip having an active surface with a plurality of bonding pads thereon and a backside surface attached to the first surface of the substrate; and
   forming a build-up circuit structure over the substrate, the build-up circuit structure including at least one insulation layer, at least one patterned circuit layer and a plurality of via openings, wherein the insulation layer is located between the active surface and the patterned circuit layer, the via openings corresponding to the bonding pads pass through the insulation layer,
   wherein the via openings is deposited by conductive material, the patterned circuit layer connects electrically with the bonding pads through the conductive material and a portion of the patterned circuit layer expands into region outside the active surface of the chips,
   wherein the space between the chip and the substrate is filled by the insulation material in the insulation layer.

8. The method of claim 7, further comprising a step of forming a plurality of solder bond pads on the patterned circuit layer.

9. The method of claim 8, further comprising a step of forming a plurality of solder balls on the solder ball pads respectively.

10. The method of claim 7, wherein the substrate is selected from one of the group consisting of metal, glass and polymer.

11. The method of claim 7, wherein the internal circuit of the substrate comprises at least one of a capacitor and an inductor.

12. The method of claim 11, wherein the internal circuit inside the substrate is electrically connected to at least one of the bonding pads on the chip.

13. An integrated circuit package, comprising:
    a substrate having a first surface and at least one cavity located on the first surface of the substrate, wherein the substrate also comprises an internal circuit;
    at least one chip having an active surface and a backside surface, wherein the chip has a plurality of bonding pads on the active surface and the backside of the chip is attached to the bottom of the cavity; and
    a build-up circuit structure on the substrate, the build-up circuit structure having at least one insulation layer, at least one patterned circuit layer and a plurality of via openings, wherein the insulation layer is located between the active surface and the patterned circuit layer, the via openings corresponding to the bonding pads pass though the insulation layer,
    wherein the via openings are deposited with conductive material, the patterned circuit layer connects electrically with the bonding pads through the conductive material and a portion of the patterned circuit layer expands into region outside the active surface of the chips,
    wherein a space between the chip and the cavity is filled by a portion of the material of the insulation layer.

14. The integrated circuit package of claim 13, wherein a space between the chip and the substrate is filled by a portion of the material of the insulation layer.

15. The integrated circuit package of claim 13, further comprising
    a plurality of solder ball pads on the patterned circuit layer; and
    a plurality of solder balls attached to the solder ball pads respectively.

16. The integrated circuit package of claim 15, further comprising a passivation layer disposed on the patterned circuit layer, wherein the passivation layer have a plurality of openings that expose the solder ball pads respectively.

17. The integrated circuit package of claim 13, wherein the substrate is selected from one of the group consisting of metal, glass and polymer.

18. The integrated circuit package of claim 13, wherein the internal circuit of the substrate comprises at least one of a capacitor and an inductor.

19. The integrated circuit package of claim 18, wherein the internal circuit within the substrate electrically connected to the bonding pads on the chip.

20. A method of forming an integrated circuit package, comprising the steps of:

provide a substrate having a first surface and at least one cavity, wherein the cavity is located on the first surface, wherein the substrate also comprises an internal circuit;

providing at least one chip having an active surface with a plurality of bonding pads thereon and a backside surface attached to the bottom surface of the cavity; and forming a build-up circuit structure over the substrate, the build-up circuit structure having at least one insulation layer, at least one patterned circuit layer and a plurality of via openings, wherein the insulation layer is located between the active surface and the patterned circuit layer, the via openings corresponding to the bonding pads pass trough the insulation layer, the via openings is deposited by conductive material, wherein the patterned circuit layer connects electrically with the bonding pads through the conductive material and a portion of the patterned circuit layer expands into region outside the active surface of the chip, wherein a cavity space between the chip and the substrate is filled by a portion of the insulation material, in the insulation layer.

21. The method of claim 20, further comprising a step of forming a plurality of solder bond pads on the patterned circuit layer.

22. The method of claim 21, further comprising a step of forming a plurality of solder balls on the solder ball pads respectively.

23. The method of claim 20, wherein a portion of the insulation material in the insulation layer fills the space between the chip and the substrate.

24. The method of claim 20, wherein the substrate is selected from one of the group consisting of metal, glass and polymer.

25. The method of claim 20, wherein the internal circuit of the substrate comprises at least one of a capacitor and an inductor.

26. The method of claim 25, wherein the internal circuit inside the substrate is electrically connected to at least one of the bonding pads on the chip.

* * * * *